(12) United States Patent
Takeda

(10) Patent No.: US 6,549,868 B2
(45) Date of Patent: Apr. 15, 2003

(54) SEMICONDUCTOR DEVICE TEST SYSTEM AND TEST METHOD

(75) Inventor: Kunihiro Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 64 days.

(21) Appl. No.: 09/842,158

(22) Filed: Apr. 26, 2001

(65) Prior Publication Data

US 2001/0039485 A1 Nov. 8, 2001

(30) Foreign Application Priority Data

Apr. 26, 2000 (JP) ........................................ 2000-125471

(51) Int. Cl.[7] .......................... G01L 15/00; G01R 31/04; G01R 31/28
(52) U.S. Cl. ..................... 702/121; 324/158.1; 714/721
(58) Field of Search .................................. 702/108, 118, 702/121, 123; 324/73.1, 765, 158.1; 714/721

(56) References Cited

U.S. PATENT DOCUMENTS 5,400,344 A * 3/1995 Mori .......................... 714/721

FOREIGN PATENT DOCUMENTS

JP 6-314726 11/1994

* cited by examiner

*Primary Examiner*—John E. Barlow, Jr.
*Assistant Examiner*—John Le
(74) *Attorney, Agent, or Firm*—Sughrue Mion, PLLC

(57) ABSTRACT

A magnetic field is applied to a defective semiconductor device to be tested. A current is applied from a power supply to a wiring of the semiconductor device. At this time, a stress occurs to the wiring of the semiconductor device. A stress detector detects the stress and creates a first stress image. Next, a same magnetic field and a same current are applied to a good semiconductor device same in type and a stress is detected. By doing so, a second stress image as a comparison stress image is created. Next, a difference image between the first and second stress images is created by an image processor. As a result, only a stress resulting from a leak current is extracted. Next, the difference image is compared with a wiring pattern image of the semiconductor device to thereby specify a leakage portion.

10 Claims, 9 Drawing Sheets

SEMICONDUCTOR DEVICE TEST SYSTEM AND TEST METHOD

BACKGROUND OF THE INVENTION

1. Field of the Invention

The present invention relates to a semiconductor device test system and a semiconductor device test method for specifying a leakage portion on the wiring of a semiconductor device such as an LSI (large scale integrated circuit). The present invention particularly relates to a semiconductor device test system and a semiconductor device test method for specifying a leakage portion on a semiconductor device by applying a current and a magnetic field to the semiconductor device and detecting a stress generated thereby.

2. Description of the Related Art

Recently, semiconductor devices tend to be very small in size and highly integrated. Due to this, if a leak current occurs to a wiring in a semiconductor device, it becomes more difficult to specify a leakage portion.

Now, by way of example, a conventional test system and a conventional test method for specifying the leakage portion of a semiconductor device will be shown. The test system and the test method specify a portion to which a leak current occurs by detecting a magnetic field generated by the leak current.

FIG. 1 is a block diagram showing the constitution of this test system. A stage 54 is provided in a testing section 50. A semiconductor device 55 to be tested is mounted on the stage 54. A microscope 51 for observing the wiring pattern of the semiconductor device 55, an image detector 52 for converting an image obtained by the microscope 51 into an electrical signal and a light source 53 for illuminating the semiconductor device 55 are arranged above the stage 54 and the semiconductor device 55. Also, a magnetic field measuring terminal 58 for detecting a magnetic field generated from the semiconductor device 55 is provided in the testing section 50.

Meanwhile, a power supply 57 for allowing current to flow the semiconductor device 55 is provided outside of the testing section 50. There is also provided a position controller 62 into which the detection signal of the image detector 52 is inputted, for moving the microscope 51, the image detector 52 and the light source 53 based on this detection signal and controlling their positions. Further, a signal outputted from the magnetic field detection terminal 58 is inputted into a magnetic field detector 59. Besides, there is provided a control computer 60 for controlling the position controller 62, the magnetic field detector 59, the light source 53 and the stage 54. The input and output signals of the control computer 60 are inputted into and outputted from each of the position controller 62, the magnetic field detector 59, the light source 53 and the stage 54. There is further provided an image processor 63 for recognizing and processing, as images, the wiring pattern of the semiconductor device 55 obtained by the image detector 52 and a magnetic field detection result about the semiconductor device 55 obtained by the magnetic field detector 59. A signal outputted from the control computer 60 is inputted into the image processor 63. The output signal of the image processor 63 is inputted into an image display unit 64 and displayed thereon as an image. An instruction signal is inputted into the control computer 60 by an input unit 61.

Next, a semiconductor device test method using the test system shown in FIG. 1 will be described. FIG. 2 is a flow chart showing procedures for this test method. First, as shown in a step S401 of FIG. 2, a defective semiconductor device 55 is mounted on the stage 54 shown in FIG. 1. Next, as shown in a step S402, instructions for controlling the positions of the microscope 51, the image detector 52 and the light source 53 and the position and inclination of the stage 54 are inputted into the control computer 60 by the input unit 61. The input signal is outputted from the control computer 60 and inputted into the position controller 62 to control the positions of the microscope 51, the image detector 52 and the light source 53. In addition, this input signal is inputted into the stage 54 to control the position and inclination of the stage 54. Thereafter, using the microscope 51, the wiring pattern of the semiconductor device 55 illuminated by the light source 53 is observed and a wiring pattern image is picked up. Next, the image detector 52 converts the pattern image obtained by the microscope 51 into an electrical signal. Then, the image detector 52 outputs the electrical signal to the image processor 63 through the control computer 60. The image processor 63 recognizes the pattern image as an image and outputs the pattern image to the image display unit 64. The image display unit 64 displays the pattern image. Thereafter, as shown in a step S403, the image processor 63 records this pattern image data.

Then, as shown in a step S404, a current is inputted from the power supply 57 into the wiring of the semiconductor device 55 to turn the semiconductor device 55 into a defective operation state. As shown in a step S405, the magnetic field measuring terminal 58 detects a magnetic field generated on the wiring of the semiconductor device 55. Next, as shown in a step S406, the magnetic field measuring terminal 58 converts the detected magnetic field into an electrical signal and feeds the electrical signal to the magnetic field detector 59. The magnetic field detector 58 processes the electrical signal and outputs the resultant electrical signal to the image processor 63 through the control computer 60. The image processor 63 creates a magnetic field image based on this output signal and feeds the created image to the image display unit 64. The image display unit 64 displays the magnetic field image. Then, as shown in a step S407, the image processor 63 records the magnetic field image. As shown in a step S408, the image processor 63 creates a synthetic image by superposing the magnetic field image on the previously recorded pattern image. Then, as shown in a step S409, the image display unit 64 displays this superposed image. Next, as shown in a step S410, the data analysis of this synthetic image is performed to thereby specify a leakage portion.

Furthermore, as another conventional test method, Japanese Patent Unexamined Application Publication No. 6-314726 discloses a method of applying a magnetic field in perpendicular direction to the wiring of a defective semiconductor device while voltage is being applied to the device, irradiating the wiring with primary electrons and detecting secondary electrons. According to this method, it is possible to measure a leak current value from the potential difference in the width direction of the wiring.

The above-stated conventional techniques have, however, the following disadvantages. According to the method of detecting a magnetic field generated by a leak current, a magnetic field derived from a leak current and that derived from a normal current are included in detected magnetic fields. Due to this, the magnetic field generated by the leak current is often cancelled depending on the manner in which the normal current flows, with the result that a leakage portion cannot be disadvantageously specified.

Furthermore, according to the method disclosed by Japanese Patent Unexamined Application Publication No. 6-314726, if a leakage portion is covered with another wiring, primary electrons do not reach the leakage portion and the leakage portion cannot be, therefore, disadvantageously specified.

SUMMARY OF THE INVENTION

It is an object of the present invention to provide a semiconductor device test system and a semiconductor device test method capable of showing a leak current while separating the leak current from a normal current and accurately specifying a leakage portion even if the leakage portion is covered with another wiring.

A semiconductor device test system for specifying a portion of a semiconductor device in which leak current occurs, comprises: a magnetic field generator for applying magnetic field to said semiconductor device; a power supply for allowing current to flow through a wiring of said semiconductor device in said magnetic field; a stress detector for detecting a stress occurring to said wiring by allowing current to flow in said magnetic field and outputting stress image data; an observation unit for observing a wiring pattern of said semiconductor device and outputting wiring pattern image data; and an image display unit for displaying stress images and wiring pattern images based on said stress image data and said wiring pattern image data, respectively.

In the present invention, a current is inputted into the wiring of the semiconductor device while applying a magnetic field to the semiconductor device. By doing so, a stress corresponding to the current is generated on the wiring and the stress is detected. As a result, a leakage portion can be specified. Also, it is possible to detect the direction of the leak current from the direction of the stress. Further, since the stress generated by the magnetic field and the current is detected, a leakage portion can be specified even if the leakage portion is located under another wiring.

Further, the above-stated semiconductor device test system preferably comprises: a storage device for storing said stress image data and said wiring pattern image data; and an image processor for processing said stress image data and said wiring pattern image data, and for creating a superposed image of said images and a difference image among said images. If so, it is possible to specify a leakage portion more accurately, more efficiently.

Furthermore, the magnetic field generator preferably generates a plurality of magnetic fields in different states. If so, it is possible to further improve testing accuracy.

A semiconductor device test method for specifying a portion of a semiconductor device to which portion a leak current occurs according to the present invention, comprises the steps of: applying a magnetic field to the semiconductor device; allowing current to flow through a wiring of the semiconductor device in the magnetic field; detecting a stress occurring to the wiring and creating a stress image by allowing current to flow the wiring of the semiconductor device in the magnetic field; creating another stress image as a comparison stress image; creating a difference image between the stress image of the semiconductor device and the comparison stress image; and comparing the difference image with a wiring pattern image of the semiconductor device.

Also, a plurality of magnetic fields in different states are preferably used as the magnetic field.

Moreover, in the above-stated semiconductor device test method, a same magnetic field and a same current as the magnetic field and the current applied to the semiconductor device are applied to a good semiconductor device same in type as the semiconductor device and a stress occurring to the wiring is detected, thereby making it possible to create the comparison stress image.

Further, a same magnetic field as the magnetic field applied when the stress image is created, is applied to the semiconductor device, and a current is applied to a wiring of the semiconductor device so as to turn the semiconductor device into a good operation state and a stress generated at this time is detected, thereby making it possible to create the comparison stress image.

Additionally, the comparison stress image may be created by a simulation presuming a good operation state of the semiconductor device.

On the other hand, the wiring pattern image may be created based on design data on the semiconductor device.

In the present invention, a specific magnetic field is applied to a defective semiconductor device while applying thereto a current and a generated stress is compared with that of a good semiconductor device, whereby a leak current and a normal current flowing in the semiconductor device can be shown while separating the currents from each other. As a result, it is possible to specify a current leakage portion in the semiconductor device. In addition, the test system and the test method according to the present invention allow knowing the direction of a leak current and specifying a leakage portion even if the leak current occurs to a portion covered with another wiring.

DETAILED DESCRIPTION OF THE PREFERRED EMBODIMENTS

Figure 1:
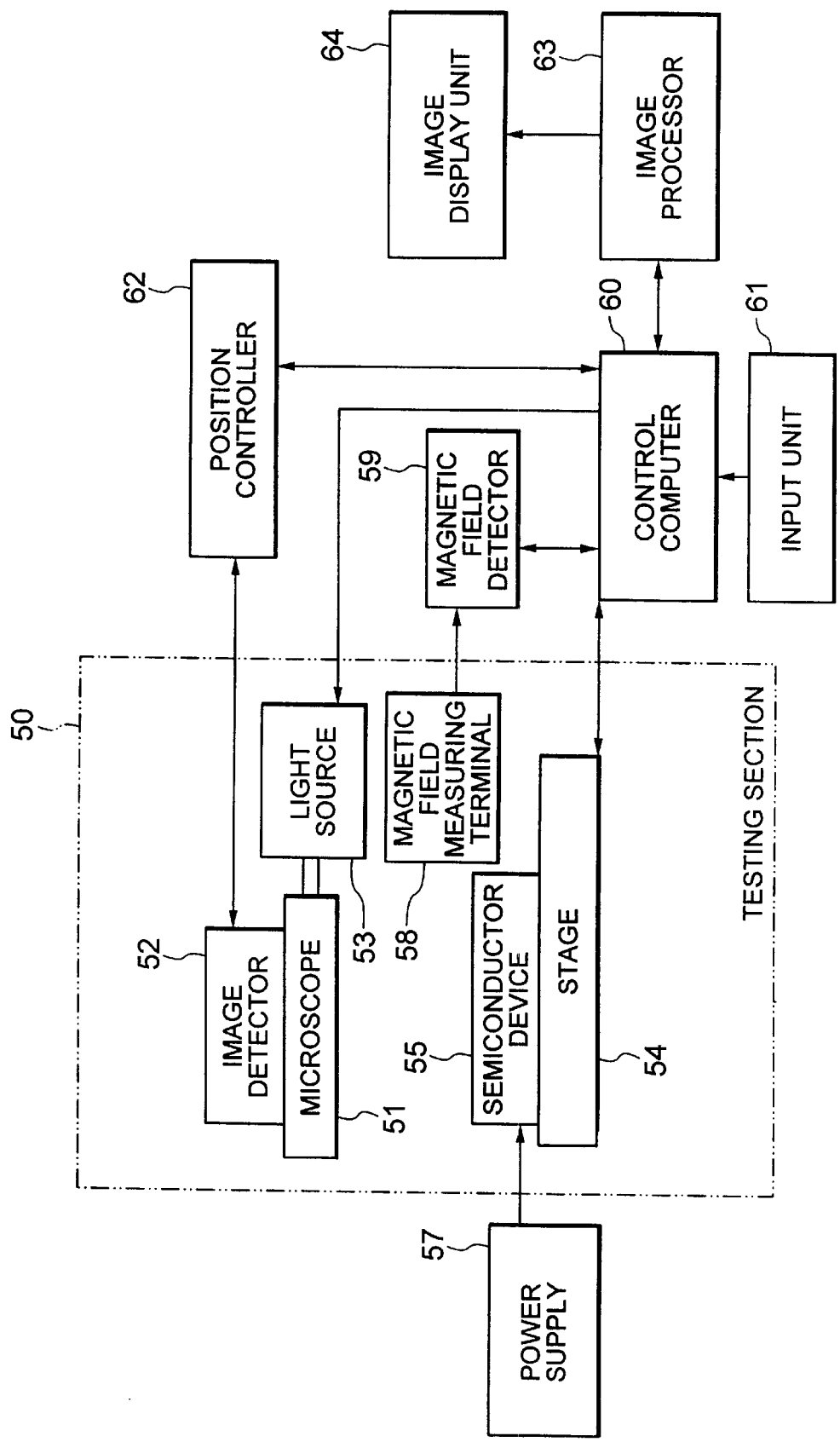
FIG. 1 is a block diagram showing the constitution of a conventional semiconductor device test system.
Figure 2:
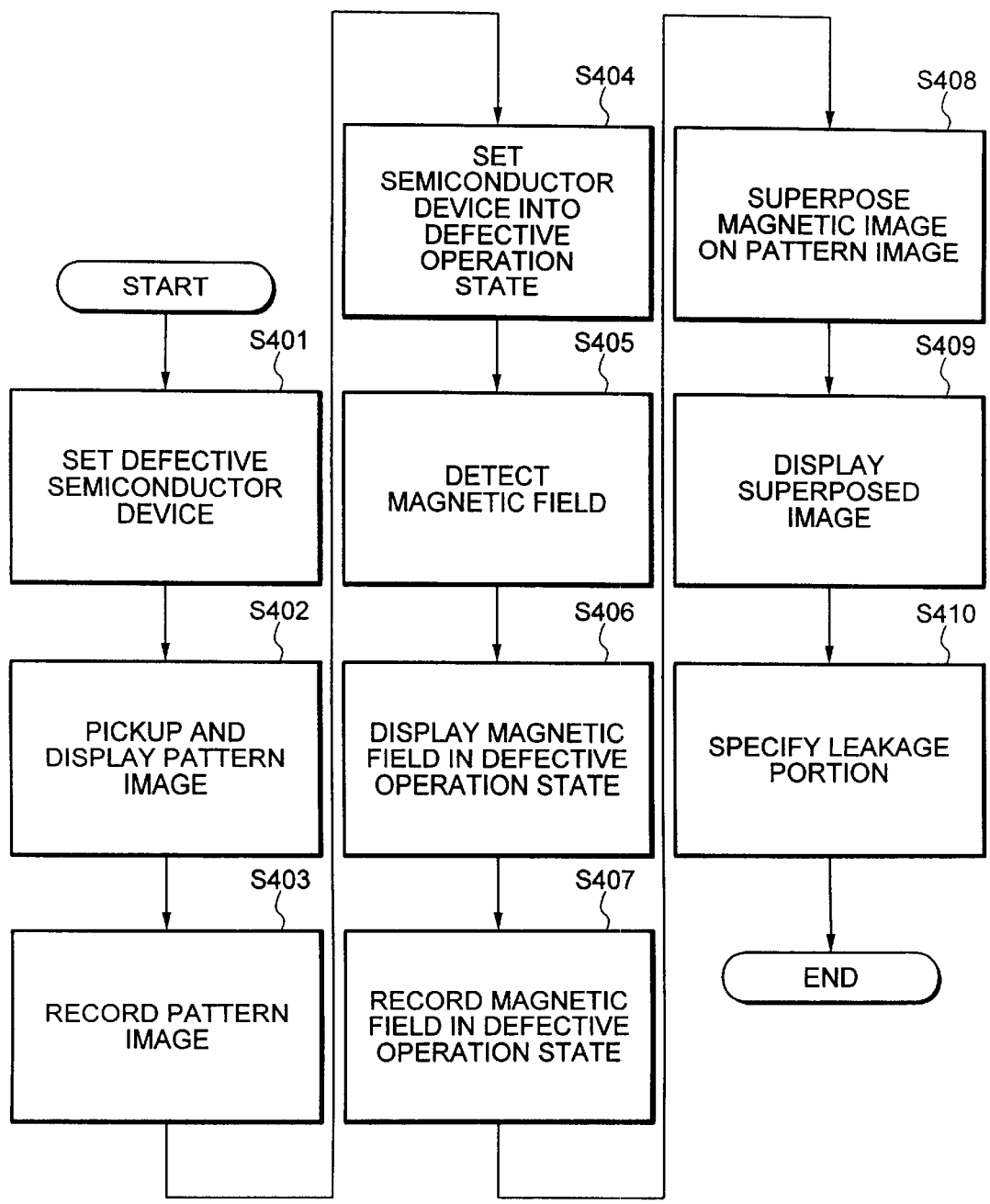
FIG. 2 is a flow chart showing procedures for a conventional semiconductor device test method.
Figure 3:
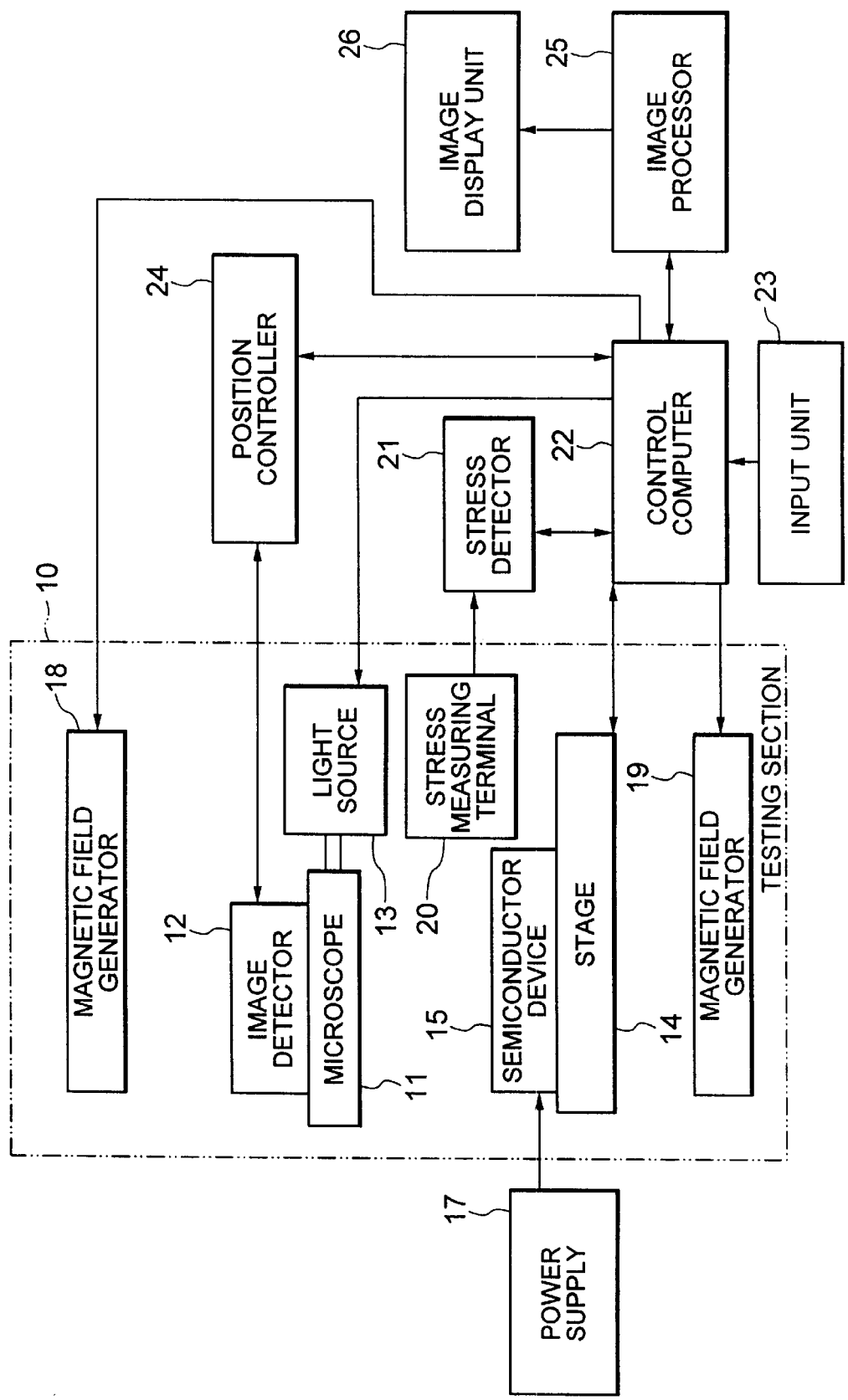
FIG. 3 is a block diagram showing the constitution of a semiconductor device test system according to the first to third embodiments of the present invention.

The embodiments of the present invention will be concretely described hereinafter with reference to the accompanying drawings. First, the first embodiment of the present invention will be described. FIG. 3 is a block diagram showing the constitution of a semiconductor device test system according to the first embodiment of the present invention. A stage 14 capable of adjusting movement, rotation and inclination along the XYZ axes is provided on a testing section 10. A semiconductor device 15 to be tested is mounted on the stage 14. A microscope 11 for observing the wiring pattern of the semiconductor device 15, an image detector 12 for converting an image obtained by the microscope 11 into an electrical signal and a light source 13 for illuminating the semiconductor device 15 are provided above the stage 14 and the semiconductor device 15 in the testing section 10. Also, magnetic field generators 18 and 19 for applying magnetic fields to the semiconductor device 15 are provided in the testing section 10. Further, a stress measuring terminal 20 of a stress detector 21 for detecting a stress generated in the wiring of the semiconductor device 15 is provided in the testing section 10.

Meanwhile, a power supply 17 for allowing current to flow the semiconductor device 15 is provided outside of the testing section 10. There is also provided a position controller 24 into which the detection signal of the image detector 12 is inputted, for moving the microscope 11, the image detector 12 and the light source 13 and controlling their positions. Further, there is provided a stress detector 21 into which a detection signal outputted from the stress measuring terminal 20 is inputted. There is also provided a control computer 22 for controlling the positions of the microscope 11, the image detector 12 and the light source 13, the intensity of the light source 13, the operation of the stress detector 21, the position and inclination of the stage 14 and the outputs of the magnetic field generators 18 and 19. The input and output signals of the control computer 22 are inputted into and outputted from each of the position controller 24, the light source 13, the stress detector 21, the stage 14 and the magnetic field generators 18 and 19.

The image processor 25 creates wiring pattern image data and stress image data based on the wiring pattern of the semiconductor device 15 obtained by the image detector 12 and a stress detection result about the semiconductor device 15 obtained by the stress detector 21, respectively, and stores them. Signals outputted from the image detector 12 and the stress detector 21 are inputted into the image processor 25 through the control computer 22. In addition, there is provided an image display unit 26 into which the output signal of the image processor 25 is inputted, for displaying an image based on this output signal. Further, there is provided an input unit 23 for inputting an instruction signal to the control computer 22.

Next, the operation of the semiconductor device test system shown in FIG. 3 will be described. First, the semiconductor device 15 is set on the stage 14. Next, instructions are given to the control computer 22 from the input unit 23 to allow the control computer 22 to control the positions of the microscope 11, the image detector 12 and the light source 13 and the position and inclination of the stage 14 so that the wiring pattern of the semiconductor device 15 can be observed. Thereafter, the wiring pattern of the semiconductor device 15 illuminated by the light source 13 is observed using the microscope 11 and the optical pattern image of the semiconductor device 15 is obtained. The image detector 12 then converts this pattern image into an electrical signal and outputs the electrical signal to the image processor 25 through the position controller 24 and the control computer 22. The image processor 25 converts this output signal into wiring pattern image data and outputs the wiring pattern image data to the image display unit 26. The image display unit 26 displays the wiring pattern image. Also, the image processor 25 records the wiring pattern image data.

Meanwhile, the control computer 22 drives the magnetic field generators 18 and 19 to apply a magnetic field to the semiconductor device 15. Also, a current is inputted from the power supply 17 into the wiring of the semiconductor device 15. At this moment, since a magnetic field and a current are applied to the wiring of the semiconductor device 15, a stress occurs to the wiring. The stress measuring terminal 20 detects this stress, converts the stress into an electrical signal and feeds the electrical signal to the stress detector 21. The stress detector 21 outputs this electrical signal to the image processor 25 through the control computer 22. The image processor 25 creates stress image data based on this electrical signal. The image processor 25 records the wiring pattern image data and the stress image data and creates a difference image and a superimposed image of these images from an arbitrary number of recorded images.

If the semiconductor device 15 is a defective semiconductor device which generates a leak current, a current flows in a portion of the wiring of the semiconductor device 15 in which a current should not originally flow, i.e., a leakage portion in addition to a normal current. Accordingly, a stress generated by the action between the magnetic field and the normal current, a stress generated by the action between the magnetic field and the leak current and a stress, such as an attracting force applied to the metallic part of the semiconductor device from the magnetic field, which does not depend on a current are included in detected stresses. On the other hand, if a good semiconductor device which does not generate any leak current is tested, a stress generated by the action between the magnetic field and the normal current and a stress which does not depend on a current are included in detected stresses. Two types of these stresses are almost the same in value between the defective device and the good device. Accordingly, the difference image between the stress image of the defective semiconductor device and that of the good semiconductor device only shows the stress derived from the leak current. By superposing the difference image on the wiring pattern image, it is possible to specify a leakage portion.

Figure 4:
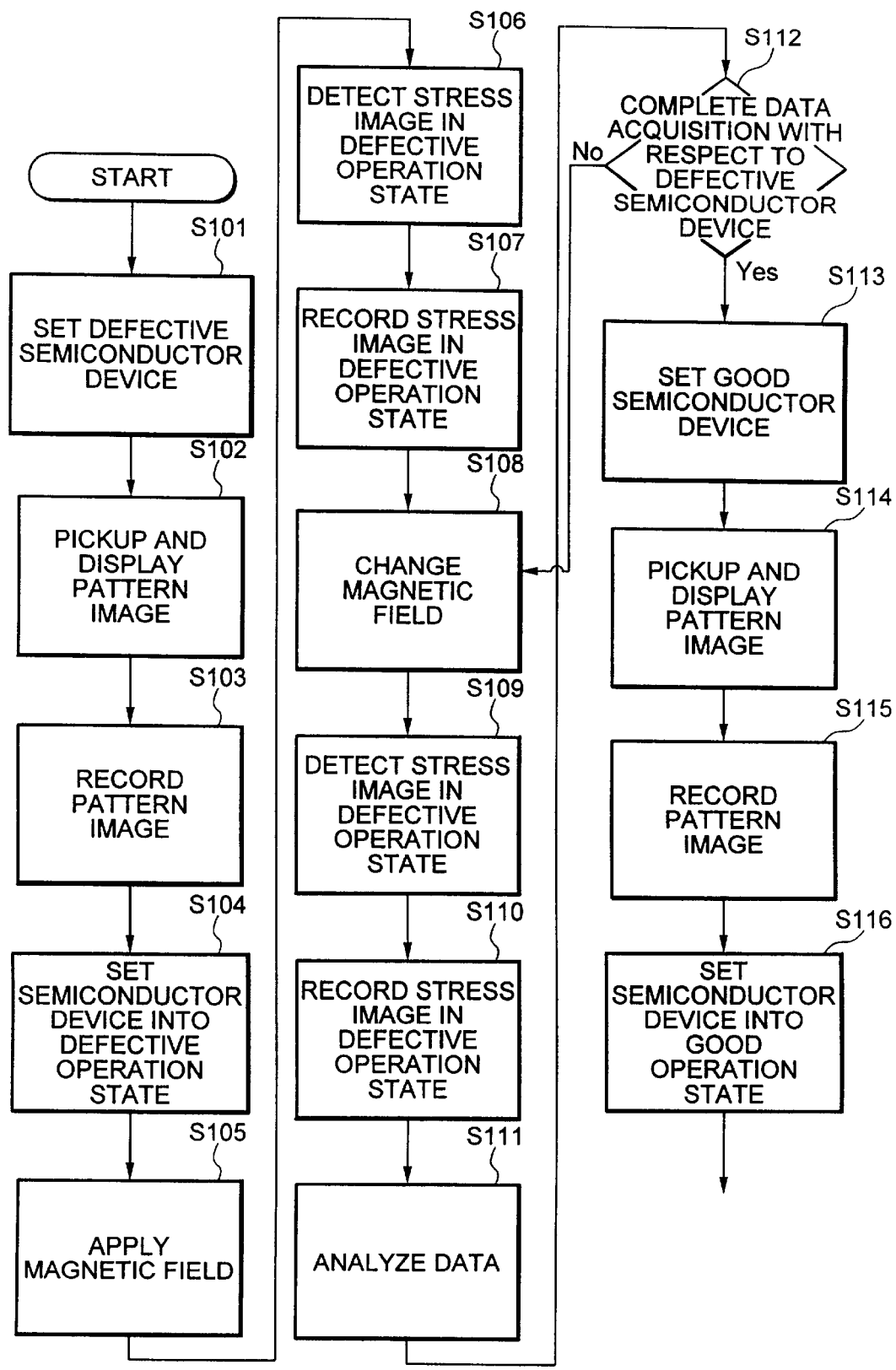
FIG. 4 is a flow chart showing procedures for a semiconductor device test method according to the first embodiment of the present invention.
Figure 5:
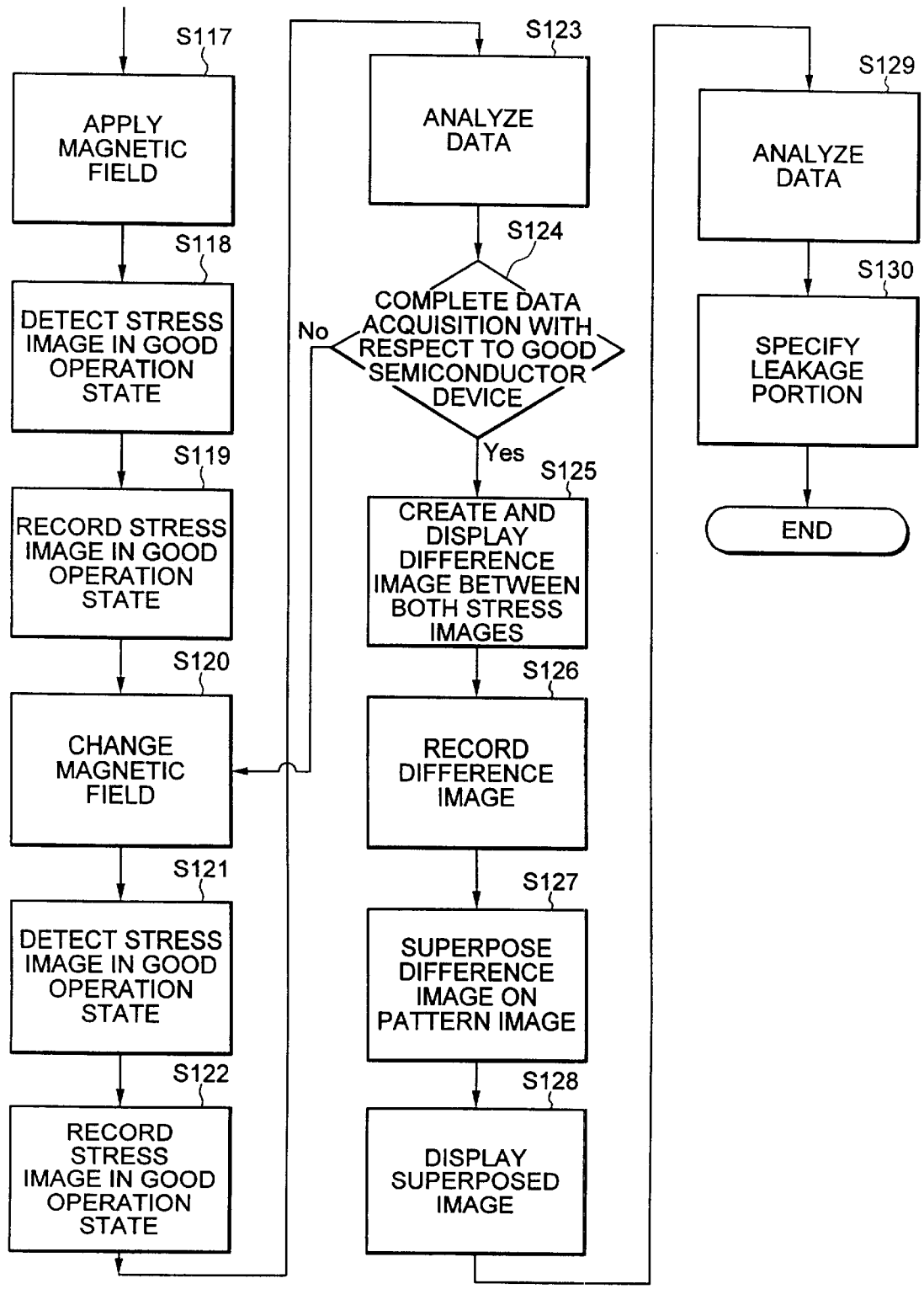
FIG. 5 is a flow chart showing procedures following those shown in FIG. 4 for the semiconductor device test method according to the first embodiment of the present invention.

Next, a semiconductor device test method according to this embodiment will be described. In this method, the test system shown in FIG. 3 is employed. FIGS. 4 and 5 are flow charts showing procedures for the semiconductor device test method in this embodiment. First, as shown in a step S101 of FIG. 4, a defective semiconductor device 15 is set on the stage 14 shown in FIG. 3. Next, as shown in a step S102, an instructions are inputted into the control computer 22 from the input unit 23 to allow the control computer 22 to control the microscope 11, the image detector 12, the light source 13 and the stage 14 to thereby observe the wiring pattern of the semiconductor device 15 and picks up a wiring pattern image thereof. The image detector 12 converts this observation result into an electrical signal and outputs the electrical signal to the image processor 25 through the position controller 24 and the control computer 22. Then, the image processor 25 creates wiring pattern image data based on this electrical signal and outputs the wiring pattern image data to the image display unit 26. The image display unit 26 displays the wiring pattern image. Thereafter, as shown in a step S103, the image processor 25 records the wiring pattern image data.

Next, as shown in a step S104, a current is inputted from the power supply 17 into the wiring of the semiconductor device 15 to turn the semiconductor device 15 into a defective operation state. At this moment, a current flows in a portion of the semiconductor device 15 in which a current should not originally flow, i.e., a leakage portion in addition to a normal current. Then, as shown in a step S105, the control computer 22 drives the magnetic field generators 18 and 19 to apply a magnetic field to the semiconductor device 15. At this moment, since a current and a magnetic field are applied to the wiring of the semiconductor device 15, a stress occurs to the wiring. Next, as shown in a step S106, the stress measuring terminal detects this stress, converts the detected stress into an electrical signal and feeds the electrical signal to the stress detector 21. As a result, the stress detector 21 detects a stress image. Next, as shown in a step S107, the stress detector 21 outputs a detection signal to the image processor 25 through the control computer 22. The image processor 25 creates stress image data based on this detection signal and outputs the stress image data to the image display unit 26. The image display unit 26 displays the stress image based on the stress image data. Thereafter, the image processor 25 records the stress image data.

Next, magnetic field conditions are changed and the same operations as those shown in the steps S105 to S107 is carried out. That is, as shown in steps S108 to S110, a magnetic field different in conditions from the magnetic field applied in the step S105 is applied to the semiconductor device 15 which has been turned into a defective operation state, a stress occurring to the wiring of the semiconductor device 15 is detected and stress image data is created and recorded. Then, as shown in a step S111, the stress image data obtained through the series of operations is subjected to data analysis. Next, as shown in a step S112, the operations in the steps S108 to S111 are repeated. At the time when it is judged that sufficient data for specifying a leakage portion have been obtained, data acquisition with respect to the defective semiconductor device is completed.

Next, the semiconductor device 15 to be tested is replaced with the same type of a good semiconductor device as the above-stated defective device and the same operations as those executed to the defective semiconductor device are carried out. That is, as show in steps S113 to S115, the wiring pattern image of the good semiconductor device 15 is picked up, displayed and recorded. Next, as shown in a step S116, the same current as that inputted into the defective semiconductor device in the step S104 is inputted into the good semiconductor device to thereby turn the device into a good operation state.

Next, as shown in a step S117 of FIG. 5, the same magnetic field as that applied to the defective semiconductor device in the step S105 is applied to the good semiconductor device. At this moment, as shown in steps S118 and S119, a stress occurring to the semiconductor device is detected, stress image data is obtained and then recorded. Thereafter, as shown in steps S120 to S122, magnetic field conditions are changed and the same operations are carried out. Then, as shown in a step S123, the stress image data obtained in the series of operations is subjected to data analysis. Next, as shown in a step S124, the operations in the steps S120 to S123 are repeated. At the time when it is judged that sufficient data for specifying a leakage portion has been obtained, data acquisition with respect to the good semiconductor device is completed.

Thereafter, as shown in a step S125, the image processor 25 analyzes the stress image data of the defective and good semiconductor devices thus obtained. The difference image between the stress image of the defective semiconductor device and that of the good semiconductor device under the same magnetic field conditions is obtained and displayed on the image display unit 26. Then, as shown in a step S126, the difference image is recorded.

Next, as shown in steps S127 and S128, a synthetic image is created by superposing this difference image on the previously recorded pattern image and the synthetic image is displayed. As shown in steps S129 and S130, data analysis is performed to thereby specify a leakage portion.

As can be seen from the above, according to the test system and the test method using the test system in this embodiment, it is possible to extract only the stress generated by the leak current by obtaining the difference image between the stress image of the defective semiconductor device and that of the good semiconductor device. By superposing the difference image on the pattern image of the semiconductor device, it is possible to accurately specify a portion to which the leak current occurs. Further, since the direction of a stress generated differs according to the direction of a current, it is possible to know the direction of the leak current. Besides, differently from the method of detecting the leakage portion of the semiconductor device using an emission microscope, it is possible to specify a leakage portion even if a leak current occurs to a portion covered with another wiring.

Figure 6:
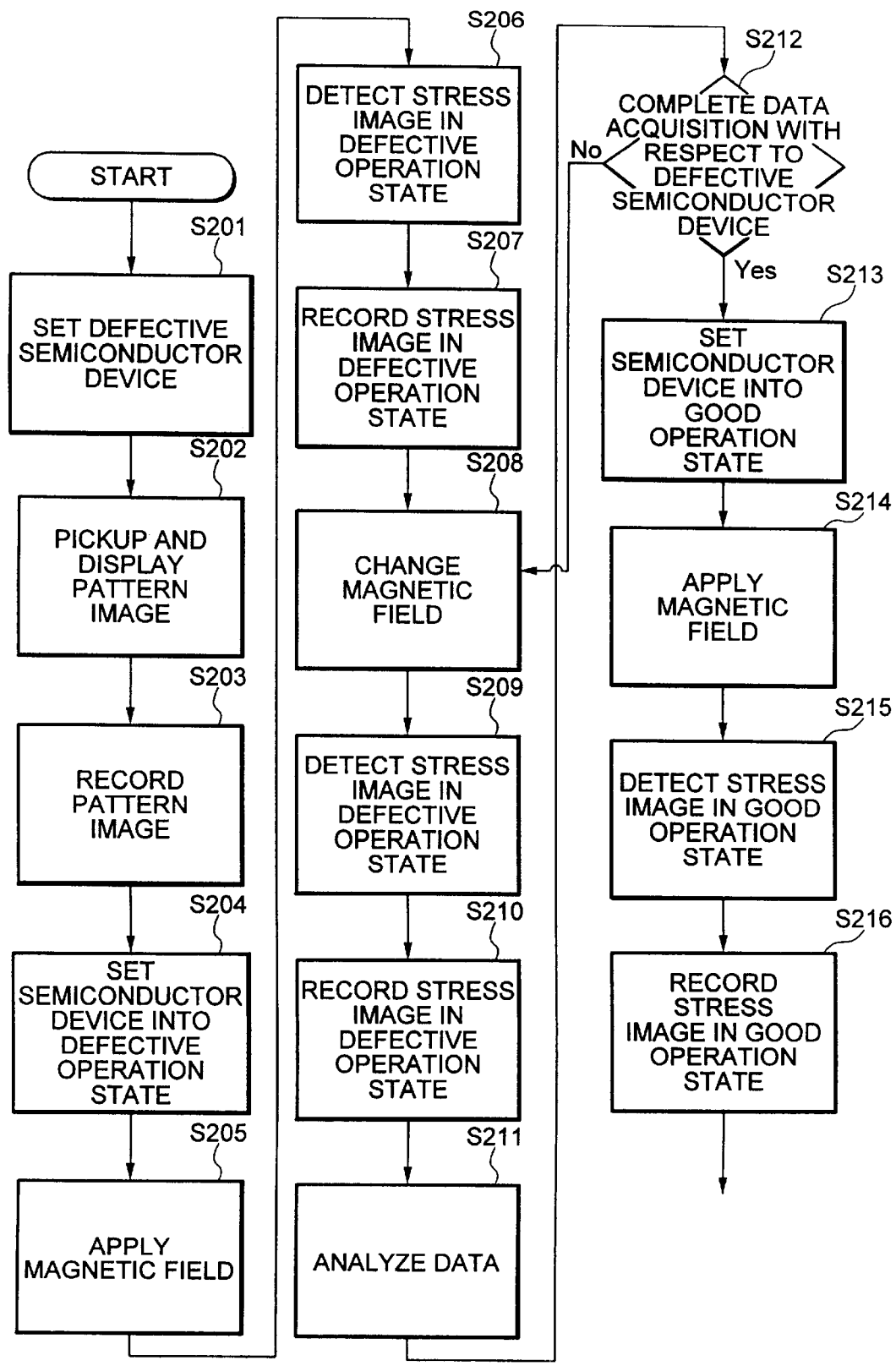
FIG. 6 is a flow chart showing procedures for a semiconductor device test method according to the second embodiment of the present invention.
Figure 7:
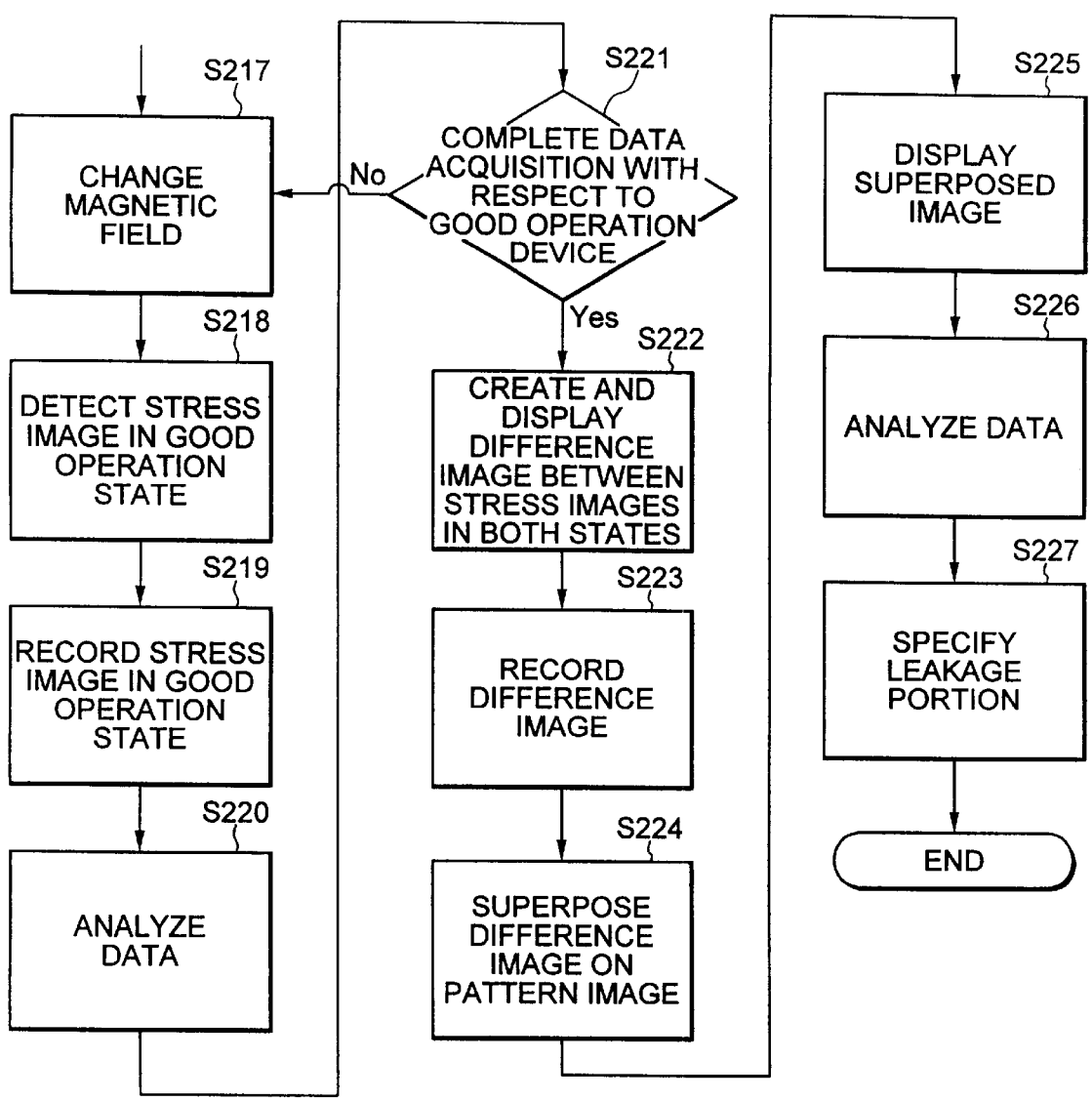
FIG. 7 is a flow chart showing procedures following those shown in FIG. 6 for the semiconductor device test method according to the second embodiment of the present invention.

Next, a semiconductor device test method according to the second embodiment of the present invention will be described with reference to FIGS. 3, 6 and 7. This embodiment relates to a test method in a case where a good operation state or a defective operation state appears depending on the operating conditions of the same semiconductor device due to a margin trouble or the like. A test system used in this embodiment is that used in the first embodiment shown in FIG. 3. FIGS. 6 and 7 are flow chart showing procedures for the test method in the second embodiment.

As shown in a step S201 of FIG. 6, a defective semiconductor device 15 is set on the stage 14 shown in FIG. 3. Next, as shown in a step S202, instructions are inputted into the control computer 22 by the input unit 23 to allow the control computer 22 to control the microscope 11, the image detector 12, the light source 13 and the stage 14 to observe the wiring pattern of the semiconductor device 15 and to pick up a wiring pattern image thereof. This observation result is converted into an electrical signal by the image detector 12. The electrical signal is inputted into the image processor 25 through the position controller 24 and the control computer 22 and displayed on the image display unit 26. Thereafter, as shown in a step S203, the pattern image is recorded on the image processor 25.

Next, as shown in a step S204, a current is inputted from the power supply 17 into the wiring of the semiconductor device 15 to turn the semiconductor device 15 into a defective operation state. At this moment, a current flows in a portion of the semiconductor device 15 in which portion a current should not originally flow, i.e., a leakage portion thereof besides a normal current. As shown in a step S205, the control computer 22 controls the magnetic field generators 18 and 19 to apply a magnetic field to the semiconductor device 15. At this moment, since a current and a magnetic field are applied to the wiring of the semiconductor device 15, a stress occurs to the wiring. Next, as shown in a step S206, the stress is detected by the stress measuring terminal 20, the detected stress is converted into an electrical signal, the electrical signal is fed to the stress detector 21 and a stress image is detected by the stress detector 21. After picking up this stress image, a detection signal is inputted into the image processor 25 through the control computer 22. The image processor 25 creates stress image data. The image display unit 26 displays the stress image based on the stress image data. Then, as shown in a step S207, the stress image data is recorded on the image processor 25.

Next, as shown in steps S208 to S210, magnetic field conditions are changed and the same operations as those shown in the steps S205 to S207 are carried out. That is, a magnetic field different in conditions from the magnetic field applied in the step S205 is applied to the semiconductor device 15 which has been turned into a defective operation state. A stress occurring to the semiconductor device 15 at this time is detected and stress image data is created. Next, as shown in a step S211, the stress image data obtained by the series of operations is subjected to data analysis. Then, as shown in a step S212, the operations in the steps S208 to S211 are repeated. At the time when it is judged that sufficient data for specifying a leakage portion has been obtained, data acquisition with respect to the defective semiconductor device is completed.

Next, as shown in a step S213, a current is inputted from the power supply 17 into the semiconductor device 15 so as to turn the semiconductor device 15 into a good operation state, thereby setting the semiconductor device 15 in a good operation state. As shown in steps S214 to S221, the same operations as those executed in the above-stated defective operation state are carried out. That is, as shown in steps S214 to S216, the same magnetic field as that applied to the semiconductor device 15 in the defective operation state is applied to the semiconductor device in the good operation state, a stress occurring to the wiring of the semiconductor device 15 at this time is detected and stress image data is obtained and recorded.

Further, as shown in steps S217 to S219 of FIG. 7, magnetic field conditions are changed and the same operations are repeated. Next, as shown in a step S220, the stress image data obtained by the above-stated series of operations is subjected to data analysis. Thereafter, as shown in a step S221, the operations in the steps S217 to S220 are repeated. At the time when it is judged that sufficient data for specifying a leakage portion has been obtained, data acquisition with respect to the good operation state is completed.

Next, as shown in a step S222, a difference image between the stress images in the defective operation states and the good operation state thus obtained is created by the image processor 25 and displayed on the image display unit 26. Thereafter, as shown in a step S223, the difference image data is recorded.

Then, as shown in a step S224, the image processor 25 creates a synthetic image by superposing the difference image on the previously recorded pattern image. As shown in a step S225, this synthetic image is displayed. As shown in steps S226 and S227, data analysis is performed to thereby specify a leakage portion.

At this moment, the stresses applied to the semiconductor device 15 in the defective operation state include a stress generated by the action between the magnetic field and the normal current, the stress generated by the action between the magnetic field and the leak current and the stress which does not depend on a current. Further, the stresses applied to the semiconductor device in the good operation state include a stress generated by the action between the magnetic field and the normal current and a stress which does not depend on a current. Among these stresses, the stress which does not depend on a current is the same in value between the defective operation state and the good operation state, while the stress derived from the normal current and the stress derived from the leak current are different in value between the defective operation state and the good operation state. Accordingly, it is necessary to analyze a plurality of difference images so as to specify a leakage portion.

In this embodiment, stress analysis is performed under a plurality of magnetic field conditions. Due to this, it is possible to obtain a plurality of difference images. It is, therefore, possible to specify the leakage portion of the defective semiconductor device without testing the good semiconductor device. Accordingly, compared with the first embodiment stated above, the stress which does not depend on a current has exactly the same value between the defective operation state and the good operation state and a more accurate test can be, therefore, conducted depending on the way to select magnetic field conditions. Furthermore, even if the same type of a good semiconductor device as the defective semiconductor device cannot be obtained, it is possible to specify a leakage portion.

Figure 8:
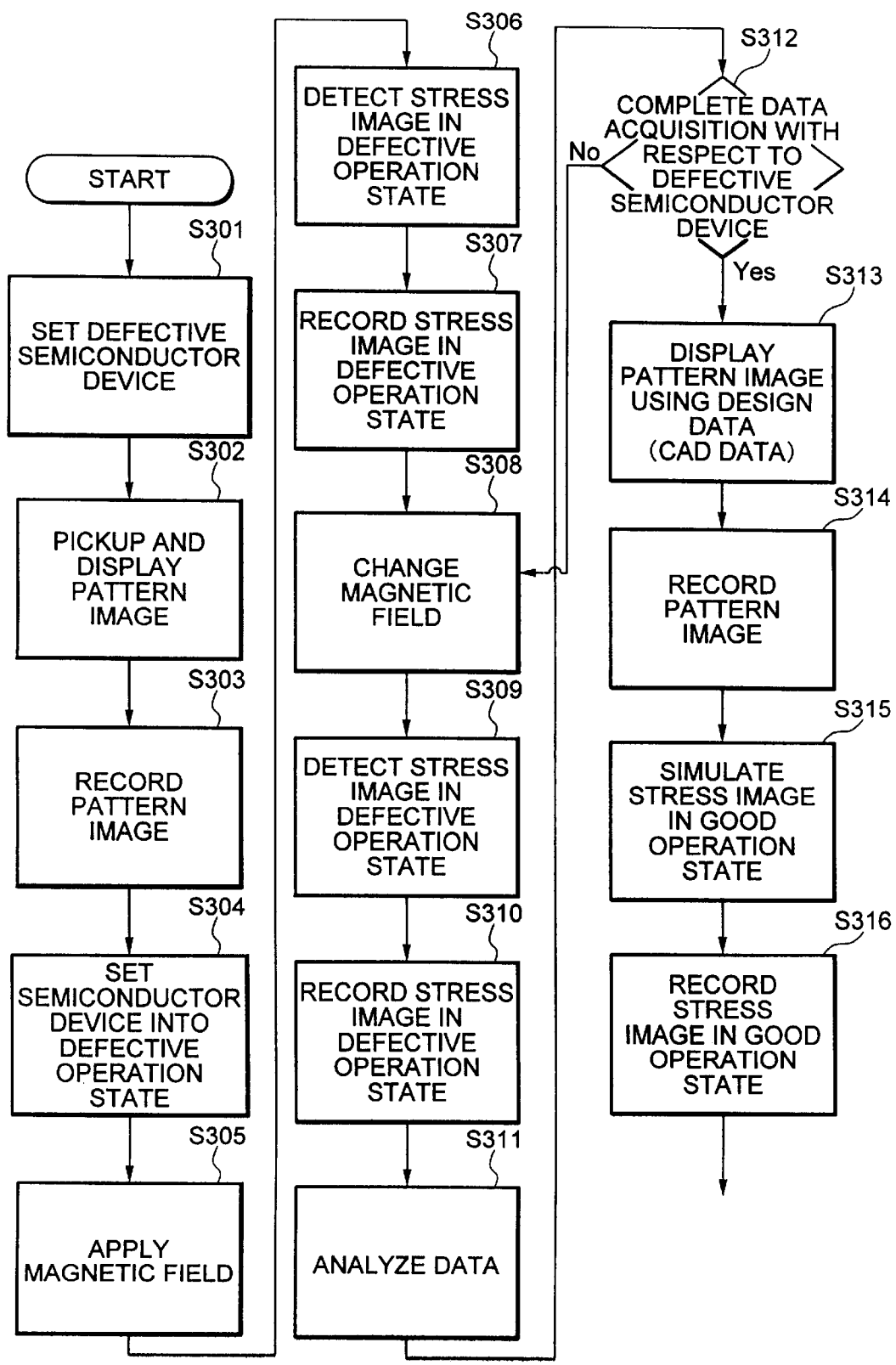
FIG. 8 is a flow chart showing procedures for a semiconductor device test method according to the third embodiment of the present invention.
Figure 9:
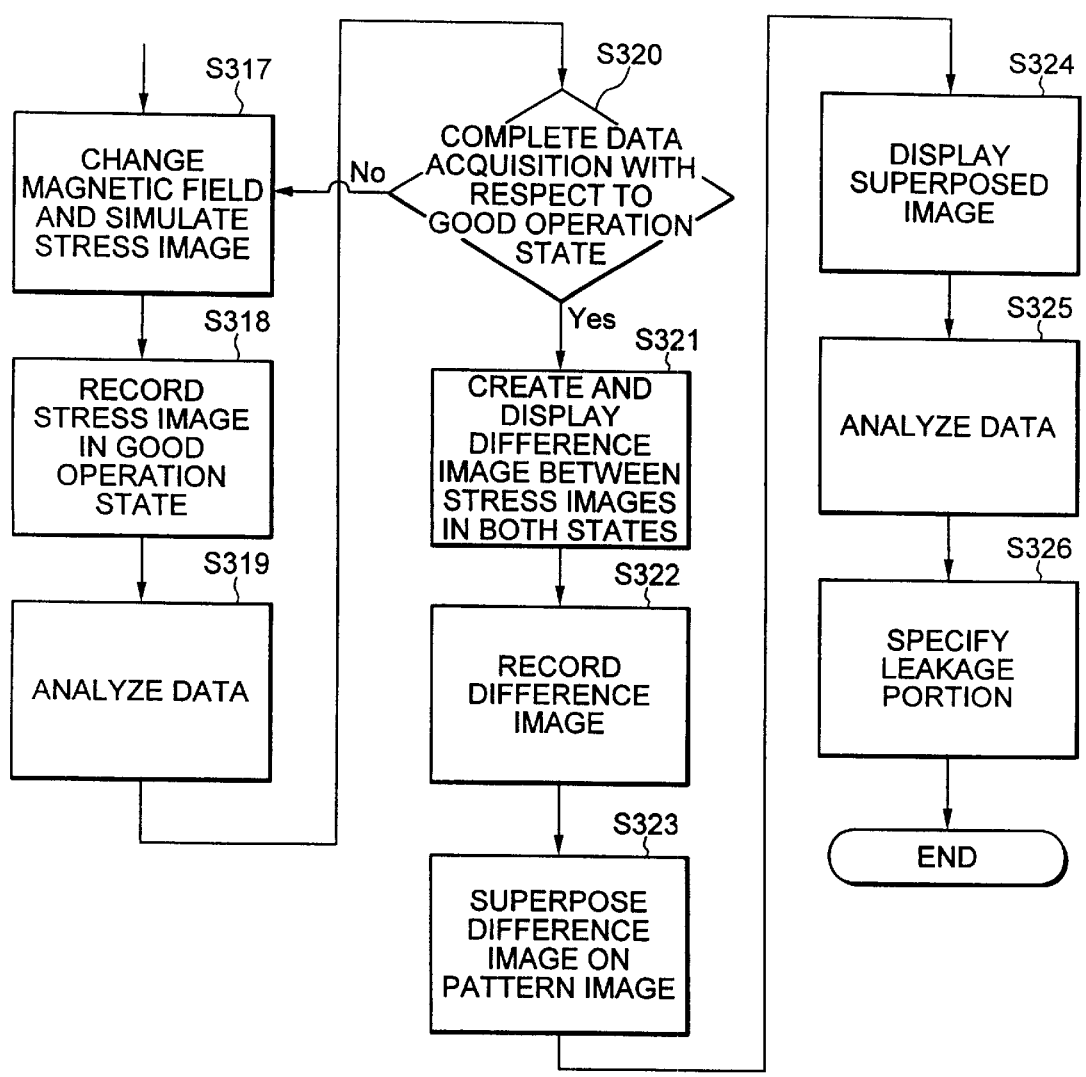
FIG. 9 is a flow chart showing procedures following those shown in FIG. 8 for the semiconductor device test method according to the third embodiment of the present invention.

Next, a semiconductor device test method according to the third embodiment of the present invention will be described with reference to FIGS. 3, 8 and 9. This embodiment relates to a test method for specifying a leakage portion while using a defective semiconductor device and design data (CAD data) on this semiconductor device. In this embodiment, the test system shown in FIG. 3 and used in the preceding first and second embodiments is employed. FIGS. 8 and 9 are flow charts showing procedures for the test method in the third embodiment.

First, as shown in a step S301 of FIG. 8, a defective semiconductor device 15 is set on the stage 14 shown in FIG. 3. Next, as shown in a step S302, instructions are inputted into the control computer 22 by the input unit 23 to allow the control computer 22 to control the microscope 11, the image detector 12, the light source 13 and the stage 14. At this moment, the wiring pattern of the semiconductor device 15 illuminated by the light source 13 is observed using the microscope 11 and an optical pattern image of the wiring is obtained. After this pattern image is converted into an electrical signal and picked up by the image detector 12, the signal is inputted into the image processor 25 through the control computer 22 and converted into wiring pattern image data. Thereafter, the wiring pattern image is displayed on the image display unit 26 based on the wiring pattern image data. Then, as shown in a step S303, the wiring pattern image data is recorded.

Next, as shown in a step S304, a current is inputted from the power supply 17 into the wiring of the semiconductor device 15 to turn the semiconductor device 15 into a defective operation state. At this moment, a current flows in a portion of the semiconductor device 15 in which a current should not originally flow, i.e., a leakage portion besides a normal current. As shown in a step S305, the control computer 22 drives the magnetic field generators 18 and 19 to apply a magnetic field to the semiconductor device 15. At this moment, since a current and a magnetic field are applied to the wiring of the semiconductor device 15, a stress occurs to this wiring. Next, as shown in a step S306, this stress is detected by the stress measuring terminal 20, the detected stress is converted into an electrical signal, the electrical signal is fed to the stress detector 21 and a stress image is detected by the stress detector 21. Next, as shown in a step S307, after picking up the stress image, a detection signal is inputted into the image processor 25 through the control computer 22. The image processor 25 creates and stores stress image data. And the image display unit 26 displays the stress image. Next, as shown in steps S308 to S310, magnetic field conditions are changed and the same operations as those in the steps S305 to S307 are carried out. That is, a magnetic field different in conditions from that applied in the step S305 is applied to the semiconductor device 15 which has been turned into a defective operation state. At this moment, a stress occurring to the wiring of the semiconductor device 15 is detected and a stress image is detected and recorded. Then, as shown in a step S311, the stress image obtained by the series of operations is subjected to data analysis. As shown in a step S312, the operations in the steps S308 to S311 are repeated. At the time when it is judged that sufficient data for specifying a leakage portion has been obtained, data acquisition with respect to the defective semiconductor device 15 is completed.

Next, as shown in a step S313, a wiring pattern image is displayed using design data (CAD data). As shown in a step S314, the wiring pattern image data is recorded. Then, as shown in a step S315, using the above-stated design data, a stress to be generated when the defective semiconductor device 15 is in a good operation state under the magnetic field conditions under which the magnetic field is applied in the step S305 is simulated. As shown in a step S316, the stress image obtained by the simulation is recorded as the stress image data of the good semiconductor device 15.

Further, as shown in steps S317 and S318 of FIG. 9, a stress image in a case of changing magnetic field conditions is simulated and the simulated stress image data thus obtained is recorded. Thereafter, as shown in a step S319, the stress images obtained by the series of operations are subjected to data analysis. Next, as shown in a step S320, the operations in the steps S317 to S319 are repeated. At the time when it is judged that sufficient data for specifying a leakage portion has been obtained, data acquisition with respect to the good operation state is completed.

Next, as shown in a step S321, a difference image between the stress images of the defective and good semiconductor devices 15 thus obtained is obtained by the image processor 25 and displayed on the image display unit 26. The difference image data is then recorded as shown in a step S322.

Next, as shown in a step S323, the image processor 25 creates a synthetic image by superposing the difference image on the previously recorded pattern image. Then, as shown in a step S324, this synthetic image is displayed. As shown in steps S325 and S326, data analysis is performed to thereby specify a leakage portion.

According to this embodiment, even if a good semiconductor device cannot be obtained or a defective semiconductor device cannot be set to a good operation state, it is possible to specify a leakage portion by using design data.

Furthermore, it is possible to specify a leakage portion by arbitrarily combining this embodiment with the first and/or second embodiment.

The test system and the test method according to the present invention can be applied to the specification of an open portion, i.e., a portion in which a circuit which should be originally closed opens. That is to say, a magnetic field and a current are applied to each of a defective semiconductor device having an open portion and a good semiconductor device of the same type as that of the defective device. Stress images occurring at this moment are detected. At this moment, if no current flows in a portion in which a current should originally flow, a difference appears between the stress image of the defective semiconductor device and the good semiconductor device under the same magnetic field conditions. Accordingly, by comparing the both data and creating a difference image, it is possible to specify an open portion.

Furthermore, the test system and the test method according to the present invention can detect the behavior of the stress of the semiconductor device as a good device and can be used as a good device analysis technique. That is, a stress image of the semiconductor device in a good operation state at the time of applying a magnetic field can be created, good device analysis can be performed by comparing the stress image with a stress image of another semiconductor device under the same conditions and a potential defect can be detected.

Moreover, while description has been given to a case where the stress of the defective semiconductor device to be tested is measured first and then the stress of the good semiconductor device or the semiconductor device in a good operation state is then measured in the above-stated embodiments, the present invention also involves a test system and a test method for simultaneously measuring the stress of a defective semiconductor device and the stress of a good semiconductor device. The present invention also involves a test system capable of making magnetic field generators movable and changing the direction of a magnetic field applied to a semiconductor device.

What is claimed is:

1. A semiconductor device test system for specifying a portion of a semiconductor device in which leak current occurs, comprising:

a magnetic field generator for applying magnetic field to said semiconductor device;

a power supply for allowing current to flow through a wiring of said semiconductor device in said magnetic field;

a stress detector for detecting a stress occurring to said wiring by allowing current to flow in said magnetic field and outputting stress image data;

an observation unit for observing a wiring pattern of said semiconductor device and outputting wiring pattern image data; and an image display unit for displaying stress images and wiring pattern images based on said stress image data and said wiring pattern image data, respectively.

2. A semiconductor device test system according to claim 1, further comprising:

a storage device for storing said stress image data and said wiring pattern image data; and an image processor for processing said stress image data and said wiring pattern image data, and for creating a superposed image of said images and a difference image among said images.

3. A semiconductor device test system according to claim 1, wherein said magnetic field generator generates a plurality of magnetic fields in different states.

4. A semiconductor device test method for specifying a portion of a semiconductor device in which leak current occurs, comprising the steps of:

applying a magnetic field to said semiconductor device;

allowing current to flow through a wiring of said semiconductor device in said magnetic field;

detecting stress occurring to said wiring and creating a stress image by allowing current to flow through the wiring of said semiconductor device in said magnetic field;

creating another stress image as a comparison stress image;

creating a difference image between said stress image of said semiconductor device and said comparison stress image; and comparing said difference image with a wiring pattern image of said semiconductor device.

5. A semiconductor device test method according to claim 4, wherein a plurality of magnetic fields in different states are used as said magnetic field.

6. A semiconductor device test method according to claim 4, wherein magnetic field and current equal to the magnetic field and the current applied to said semiconductor device are applied to a good semiconductor device in same type as said semiconductor device and a stress occurring to the wiring is detected, thereby creating said comparison stress image.

7. A semiconductor device test method according to claim 4, wherein magnetic field equal to the magnetic field applied when said stress image is created, is applied to said semiconductor device, and a current is applied to a wiring of said semiconductor device so as to turn said semiconductor device into a good operation state and a stress generated at this time is detected, thereby creating said comparison stress image.

8. A semiconductor device test method according to claim 4, wherein said comparison stress image is created by a simulation presuming a good operation state of said semiconductor device.

9. A semiconductor device test method according to claim 4, wherein said wiring pattern image is created based on an observation result using a microscope.

10. A semiconductor device test method according to claim 4, wherein said wiring pattern image is created based on design data on said semiconductor device.

* * * * *